(12) United States Patent
Sasaki

(10) Patent No.: US 11,837,520 B2
(45) Date of Patent: Dec. 5, 2023

(54) SEMICONDUCTOR DEVICE AND SEMICONDUCTOR DEVICE FABRICATION METHOD

(71) Applicant: FUJITSU LIMITED, Kawasaki (JP)

(72) Inventor: Shinya Sasaki, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 298 days.

(21) Appl. No.: 17/478,991

(22) Filed: Sep. 20, 2021

(65) Prior Publication Data

US 2022/0199487 A1    Jun. 23, 2022

(30) Foreign Application Priority Data

Dec. 23, 2020   (JP) ................................ 2020-214119

(51) Int. Cl.
| | |
|---|---|
| *H01L 23/34* | (2006.01) |
| *H01L 23/367* | (2006.01) |
| *H01L 25/065* | (2023.01) |
| *H01L 23/31* | (2006.01) |
| *H01L 25/00* | (2006.01) |
| *H01L 23/373* | (2006.01) |
| *H01L 21/56* | (2006.01) |
| *H01L 23/538* | (2006.01) |

(52) U.S. Cl.
CPC ........ *H01L 23/3675* (2013.01); *H01L 21/568* (2013.01); *H01L 23/3128* (2013.01); *H01L 23/373* (2013.01); *H01L 23/5383* (2013.01); *H01L 25/0655* (2013.01); *H01L 25/50* (2013.01)

(58) Field of Classification Search
CPC .............. H01L 23/3675; H01L 21/568; H01L 23/3128
See application file for complete search history.

(56) References Cited

U.S. PATENT DOCUMENTS

| | | | | |
|---|---|---|---|---|
| 9,842,811 | B1 * | 12/2017 | Chou ...................... | H01L 24/48 |
| 11,750,383 | B2 * | 9/2023 | Bahrami ............... | H04W 12/08 |
| | | | | 713/171 |
| 11,750,490 | B2 * | 9/2023 | Kitada .................... | H04L 43/10 |
| | | | | 370/254 |
| 2013/0043581 | A1 | 2/2013 | Negoro | |

(Continued)

FOREIGN PATENT DOCUMENTS

| | | |
|---|---|---|
| JP | H09-45827 A | 2/1997 |
| JP | 2013-42030 A | 2/2013 |

*Primary Examiner* — Thao P Le

(74) *Attorney, Agent, or Firm* — Fujitsu Patent Center

(57) ABSTRACT

The semiconductor device includes a first semiconductor IC, a second semiconductor IC with a smaller heat generation quantity than the first semiconductor IC, a first heat conduction member covering at least a portion of the first semiconductor IC, a second heat conduction member covering the second semiconductor IC and the first heat conduction member, and a heat dissipation member. The heat dissipation member covers the second heat conduction member and dissipates heat produced from the first semiconductor IC and second semiconductor IC to the exterior. A thermal conductivity of the first heat conduction member is lower than a thermal conductivity of the second heat conduction member in a horizontal direction, which is a direction in which the first semiconductor IC and the second semiconductor IC are arrayed.

17 Claims, 4 Drawing Sheets

(56) References Cited

U.S. PATENT DOCUMENTS

| | | | |
|---|---|---|---|
| 2021/0151411 A1* | 5/2021 | Cho | H01L 23/291 |
| 2023/0082412 A1* | 3/2023 | Lee | H01L 23/5385 |
| | | | 257/712 |
| 2023/0180520 A1* | 6/2023 | Jung | H10K 50/87 |
| | | | 257/40 |
| 2023/0207414 A1* | 6/2023 | Cho | H01L 23/481 |
| | | | 257/668 |
| 2023/0207417 A1* | 6/2023 | Cho | H01L 23/49838 |
| | | | 257/690 |

* cited by examiner ns particularly pointed out in the claims.

SEMICONDUCTOR DEVICE AND SEMICONDUCTOR DEVICE FABRICATION METHOD

CROSS-REFERENCE TO RELATED APPLICATION

This application is based upon and claims the benefit of priority of the prior Japanese Patent Application No. 2020-214119 filed on Dec. 23, 2020, the entire content of which is incorporated herein by reference.

FIELD

A certain aspect of the embodiments discussed herein relates to a semiconductor device and to a semiconductor device fabrication method.

BACKGROUND

The technology described below is known as a technology relating to a heat dissipation structure of a semiconductor device. For example, a semiconductor device is known that includes: a first semiconductor integrated circuit (IC) mounted on a wiring substrate; a second semiconductor IC that is mounted on the wiring substrate and has a smaller heat generation quantity than the first semiconductor IC; and a heat dissipation plate disposed above the first semiconductor IC and the second semiconductor IC. The heat dissipation plate is connected to the first semiconductor IC, and an aperture portion is formed in the heat dissipation plate at positions opposing the second semiconductor IC. An insulating resin is formed between the second semiconductor IC and inner walls of the aperture portion.

A further semiconductor device is known that includes: a wiring substrate; plural electronic components mounted on the wiring substrate; and heat conductors that are attached to the electronic components and conduct heat generated by the electronic components to a cooling component. At least one of the heat conductors has a different thermal conductivity from another of the heat conductors.

RELATED PATENT DOCUMENTS

Patent Document 1: Japanese Laid-open Patent Publication No. 2013-042030
Patent Document 2: Japanese Laid-open Patent Publication No. H09-045827

SUMMARY

According to an aspect of the embodiments, a semiconductor device includes: a first semiconductor IC; a second semiconductor IC that is smaller in heat generation quantity than the first semiconductor IC; a first heat conduction member disposed at an upper layer of at least a portion of the first semiconductor IC; a second heat conduction member disposed at an upper layer of the second semiconductor IC and surrounding the first heat conduction member; and a heat dissipation member disposed along a horizontal direction at an upper layer of the second heat conduction member, the horizontal direction being a direction in which the first semiconductor IC and the second semiconductor IC are arrayed, wherein a thermal conductivity of the first heat conduction member is lower than a thermal conductivity in the horizontal direction of the second heat conduction member.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Below, an example of an embodiment of the present invention is described with reference to the drawings. Structural elements and portions that are the same or equivalent in the respective drawings are assigned the same reference symbols, and duplicative descriptions are omitted as appropriate.

Figure 1:
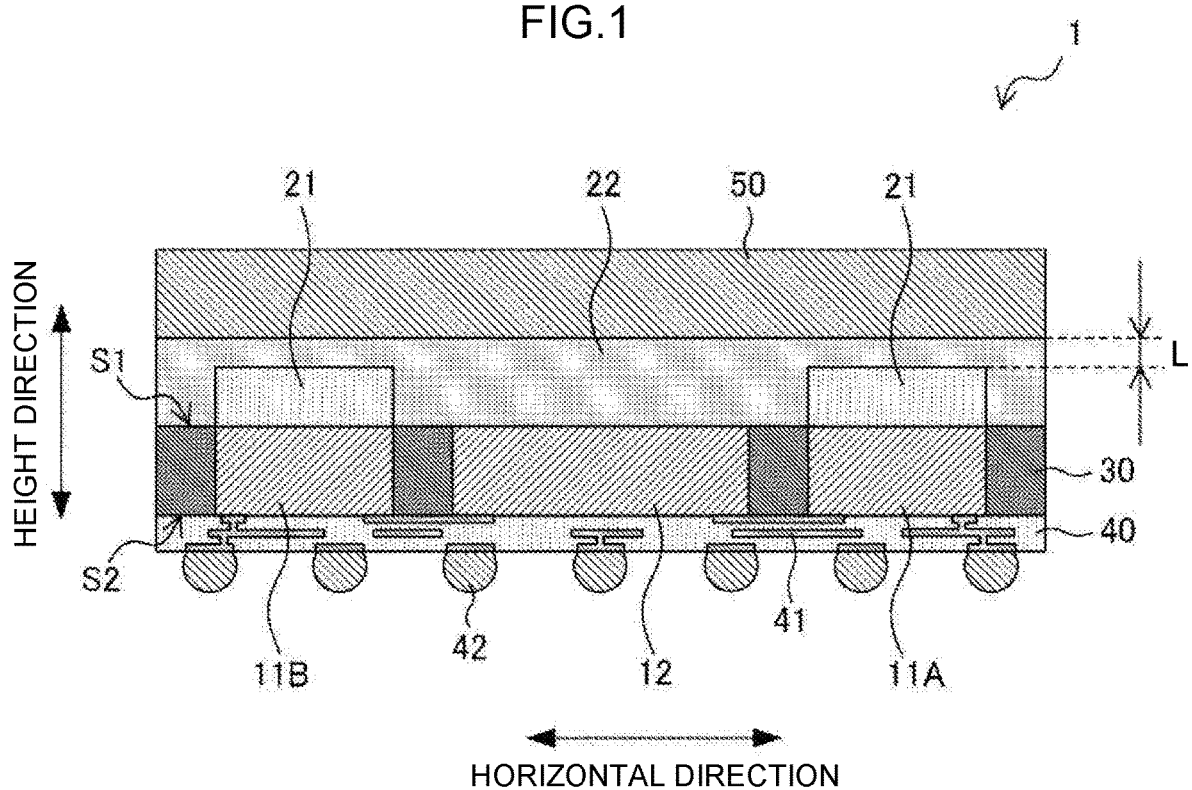
FIG. 1 is a sectional diagram depicting an example of structure of a semiconductor device according to an exemplary embodiment of the disclosed technology.

FIG. 1 is a sectional diagram depicting an example of structure of a semiconductor device 1 according to an exemplary embodiment of the disclosed technology. The semiconductor device 1 has the form of an FOWLP in which plural semiconductor ICs are packaged. First semiconductor ICs 11A and 11B have relatively large heat generation quantities, and a second semiconductor IC 12 has a relatively small heat generation quantity. The first semiconductor ICs 11A and 11B may be, for example, power devices with substrates formed of compound semiconductors such as GaN, SiC or the like. The second semiconductor IC 12 may be, for example, a control device, with a substrate formed of monocrystalline silicon, that includes a CMOS circuit that controls the first semiconductor ICs 11A and 11B. The semiconductor device 1 may constitute, for example, a phase shifter that controls phases of high-frequency signals such as millimeter waves or the like.

The first semiconductor ICs 11A and 11B and the second semiconductor IC 12 are integrally sealed in by a sealing member 30. An ordinary molding resin such as epoxy resin or the like may be employed as the sealing member 30.

A rewiring layer 40 is provided at a lower face S2 of the sealing member 30. The first semiconductor ICs 11A and 11B and the second semiconductor IC 12 are electronically connected with one another via wiring 41 formed in the rewiring laser 40. The first semiconductor ICs 11A and 11B and second semiconductor IC 12 are directly connected to the wiring 41 without the use of solder bumps. Therefore, transmission losses of high-frequency signals may be suppressed compared to a semiconductor device of a conventional flip-chip mounting type in which semiconductor ICs are mounted on a package substrate using solder bumps. In the semiconductor device 1 according to the present exemplary embodiment, chip-to-chip distances of the first semiconductor ICs 11A and 11B and the second semiconductor IC 12 are expected to be, for example, not less than 50 μm and not more than 500 μm.

Solder balls 42 that are connected to the wiring 41 are provided at a surface of the rewiring layer 40 at the opposite side thereof from the side at which the semiconductor ICs are mounted. The semiconductor device 1 is mounted at a circuit board that is not depicted in the drawings via the solder balls 42.

Surfaces of the first semiconductor ICs 11A and 11B and the second semiconductor IC 12 are exposed from an upper face S1 of the sealing member 30. A heat dissipation member 50 is provided at the upper face S1 of the sealing member 30, with first heat conduction members 21 and a second heat conduction member 22 interposed. The first heat conduction members 21 and second heat conduction member 22 are employed to promote transfers of heat produced from the first semiconductor ICs 11A and 11B and the second semiconductor IC 12.

The first heat conduction members 21 cover surfaces of the first semiconductor ICs 11A and 11B that are exposed from the sealing member 30. That is, the first heat conduction members 21 are disposed at an upper layer of the first semiconductor ICs 11A and 11B. It is sufficient that the first heat conduction members 21 cover at least portions of the surfaces of the first semiconductor ICs 11A and 11B. The example illustrated in FIG. 1 depicts a structure in which sizes of the first heat conduction members 21 in a horizontal direction are the same as sizes of the first semiconductor ICs 11A and 11B. However, the sizes of the first heat conduction members 21 in the horizontal direction may be smaller than the sizes of the first semiconductor ICs 11A and 11B. Alternatively, the sizes of the first heat conduction members 21 in the horizontal direction may be larger than the sizes of the first semiconductor ICs 11A and 11B, in which case it is preferable that the first heat conduction members 21 do not reach as far as the second semiconductor IC 12. The meaning of the term "horizontal direction" as used herein is intended to include a direction in a plane in which the first semiconductor ICs 11A and 11B and the second semiconductor IC 12 are arrayed. Another layer may be provided between the first semiconductor ICs 11A and 11B and the first heat conduction members 21.

The second heat conduction member 22 integrally covers the surface of the second semiconductor IC 12 exposed from the sealing member 30 and integrally covers the first heat conduction members 21. In other words, the first heat conduction members 21 are embedded in the second heat conduction member 22. That is, the second heat conduction member 22 is disposed at an upper layer of the second semiconductor IC 12 and surrounding the first heat conduction members 21. In order to promote transfers of heat in the horizontal direction, it is preferable if a thermal conductivity T of the second heat conduction member 22 in the horizontal direction is relatively high (for example, at least 10 W/m·k). The thermal conductivity of the second heat conduction member 22 may feature anisotropy. That is, a thermal conductivity $TC_{2Z}$ of the second heat conduction member 22 in the height direction, which is a direction intersecting the horizontal direction, may be lower than the thermal conductivity $TC_{2XY}$ in the horizontal direction ($TC_{2XY} > TC_{2Z}$). When $TC_{2XY} > TC_{2Z}$, transfers of heat from the heat dissipation member 50 to the second semiconductor IC 12 may be suppressed while transfers of heat in the horizontal direction are promoted. Another layer may be, provided between the second semiconductor IC 12 and the second heat conduction member 22.

For example, a commercially available graphite sheet may be excellently employed as the second heat conduction member 22. A graphite sheet is a sheet-shaped member in which carbon with a two-dimensional crystalline form is stacked in multiple layers. The thermal conductivity $TC_{2XY}$ of the graphite sheet in the horizontal direction is, for example, 1000 W/m·K, and the thermal conductivity $TC_{2Z}$ in the height direction is, for example, around 5 W/m·K. Alternatively, a heat spreading tape containing polyethylene terephthalate (PET) and copper may be employed as the second heat conduction member 22. The thermal conductivity $TC_{2XY}$ in the horizontal direction of the beat spreading tape containing PET and copper is, for example, 200 W/m·K, and the thermal conductivity $TC_{2Z}$ in the height direction is, for example, around 5 W/m·K.

Meanwhile, the first heat conduction members 21 may employ members whose thermal conductivity is uniform in the horizontal direction and the height direction. In the semiconductor device 1 according to the present exemplary embodiment, a thermal conductivity $TC_1$ of the first heat conduction members 21 is lower than the thermal conductivity $TC_{2XY}$ of the second heat conduction member 22 in the horizontal direction ($TC_{2XY} > TC_1$). When $TC_{2XY} > TC_1$, transfers of heat produced from the first semiconductor ICs 11A and 11B to the second semiconductor IC 12 are suppressed. For example, a commercially available heat dissipation grease may be employed as the first heat conduction members 21, which includes a filler in a resin material such as silicone resin, epoxy resin or the like.

The thermal conductivity $TC_{2Z}$ of the second heat conduction member 22 in the height direction may be lower than the thermal conductivity $TC_1$ of the first heat conduction members 21 ($TC_{2Z} < TC_1$). When $TC_{2Z} < TC_1$, it is preferable if a thickness L of regions of the second heat conduction member 22 that cover the upper faces of the first heat conduction members 21 is at most 1 mm. Accordingly, excessive suppression of transfers of heat produced from the first semiconductor 11A and 11B to the heat dissipation member 50 may be prevented. Thus, excessive rises in temperature of the first semiconductor ICs 11A and 11B may be prevented.

The heat dissipation member 50 covers the whole of the upper face of the second heat conduction member 22 and is disposed along the horizontal direction. The heat dissipation member 50 has the function of dispersing heat conducted through the first heat conduction members 21 and the second heat conduction member 22 from the semiconductor ICs to the exterior. The heat dissipation member 50 may include, for example, a metal with a relatively high thermal conductivity such as aluminum, copper or the like. Another layer may be provided between the second heat conduction member 22 and the heat dissipation member 50.

Figure 2:
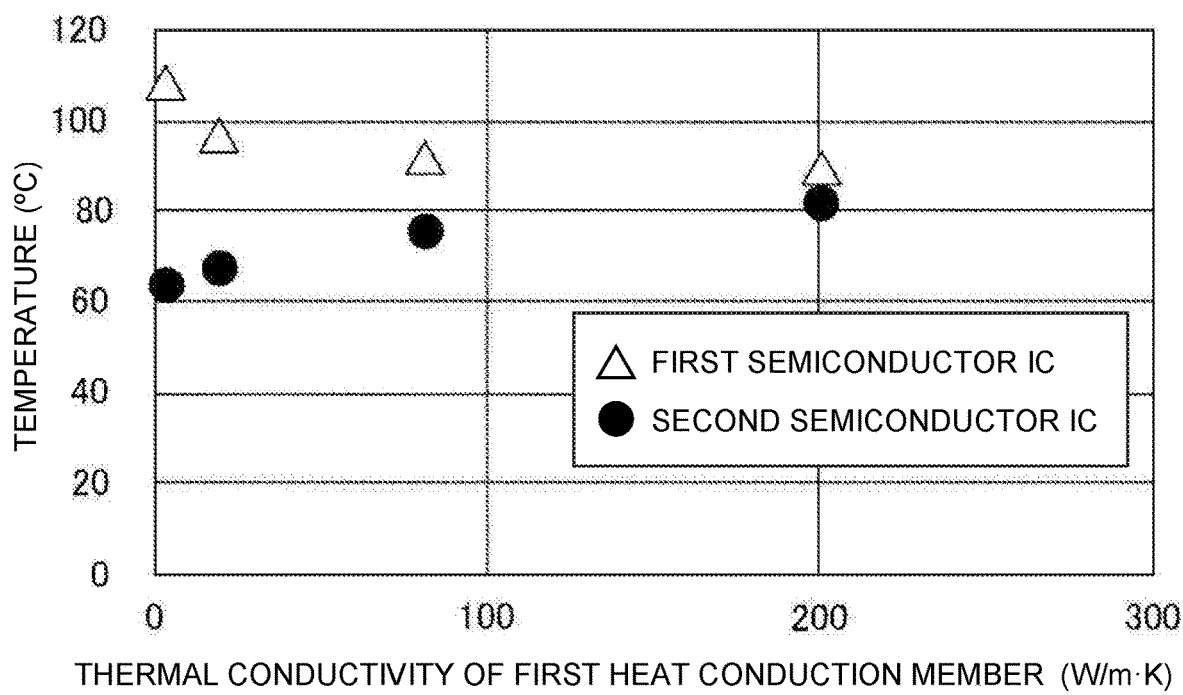
FIG. 2 is a graph illustrating results obtained by simulation of a relationship between thermal conductivity of a first heat conduction member and temperatures of a first semiconductor IC and a second semiconductor IC when the semiconductor ICs both generate heat.

FIG. 2 is a graph illustrating results obtained by simulation of a relationship between the thermal conductivity $TC_1$ of the first heat conduction members 21 and temperatures of the first semiconductor ICs 11A and 11B and the second semiconductor IC 12 when the semiconductor ICs respectively generate heat. Here, the first semiconductor ICs 11A and 11B generate heat at 10 W and the second semiconductor IC 12 generates heat at 0.1 W. The thermal conductivity $TC_{2XY}$ in the horizontal direction of the second heat conduction member 22 is set to 45 W/m·K, and the thermal conductivity $TC_{2Z}$ in the height direction is set to 5 W/m·K.

As illustrated in FIG. 2, the higher the thermal conductivity of the first heat conduction members 21, the smaller a temperature difference between the first semiconductor ICs 11A and 11B and the second semiconductor IC 12. This shows that the higher the thermal conductivity of the first heat conduction members 21, the more transfers of heat from the first semiconductor ICs 11A and 11B to the second semiconductor IC 12 are promoted.

It is verified that when the thermal conductivity $TC_1$ of the first heat conduction members 21 is lower titan the thermal conductivity $TC_{2XY}$ of the second heat conduction member 22 in the horizontal direction (45 W/m·K), an excessive rise in the temperature of the second semiconductor IC 12 may be prevented. This is because transfers of heat from the first semiconductor ICs 11A and 11B to the second semiconductor IC 12 are suppressed when $TC_1 < TC_{2XY}$.

Below, a fabrication method of the semiconductor device 1 is described. FIG. 3A to FIG. 3G are sectional diagrams illustrating examples of steps in fabrication of the semiconductor device 1.

Figure 3A:
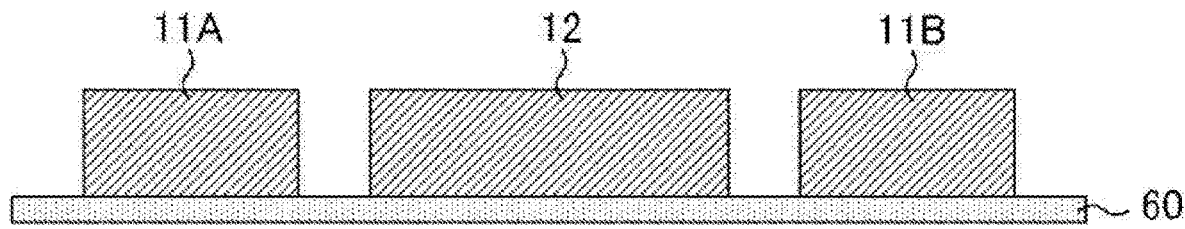
FIG. 3A is a sectional diagram illustrating an example of a step in fabrication of the semiconductor device according to the exemplary embodiment of the disclosed technology.

First the first semiconductor ICs 11A and 11B and the second semiconductor IC 12 are placed on a surface of a support tape 60 (FIG. 3A). A plural number of sets of these semiconductor ICs are placed on the support tape 60.

Figure 3B:
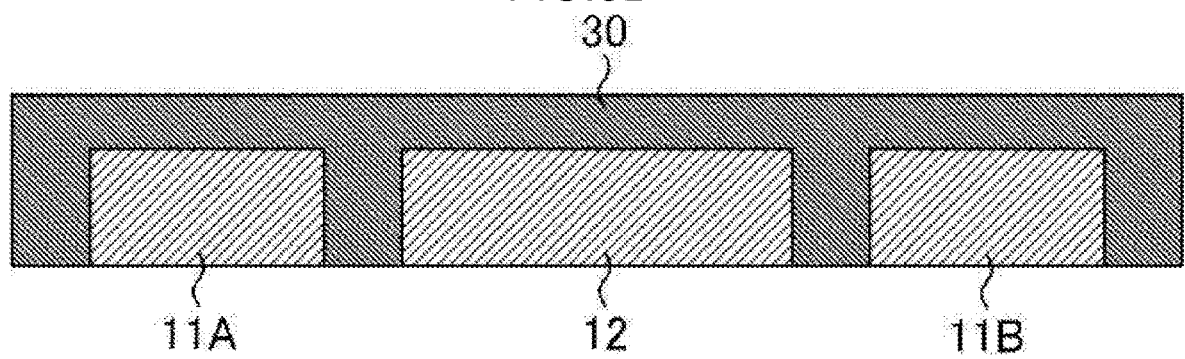
FIG. 3B is a sectional diagram illustrating an example of a step in fabrication of the semiconductor device according to the exemplary embodiment of the disclosed technology.

Then, the first semiconductor ICs 11A and 11B and second semiconductor IC 12 that have been placed on the surface of the support tape 60 are sealed in by the sealing member 30. The sealing member 30 is formed using a publicity known transfer molding technology. After the formation of the sealing member 30, the support tape 60 is removed (FIG. 3B).

Figure 3C:
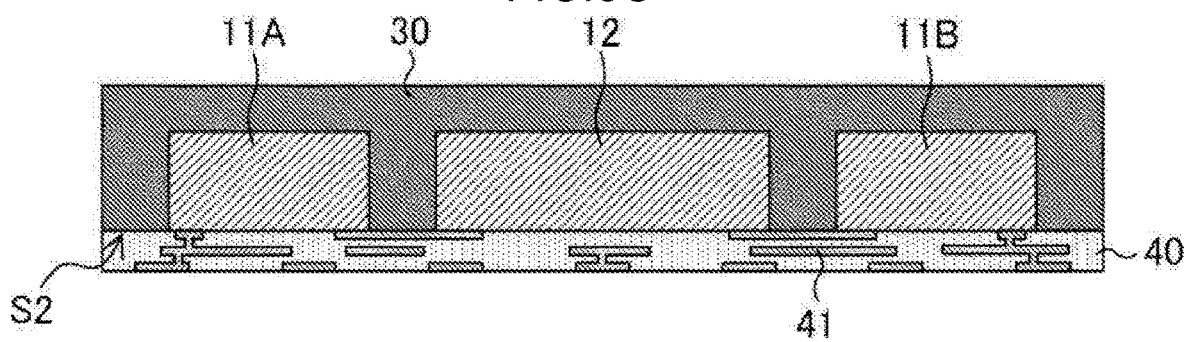
FIG. 3C is a sectional diagram illustrating an example of a step in fabrication of the semiconductor device according to the exemplary embodiment of the disclosed technology.

Then, the rewiring layer 40 is formed at the lower face S2 of the sealing member 30. The rewiring layer 40 is formed using a publicly known rewiring process. This rewiring process may include steps of, for example, polyimide coating, polyimide patterning, seed layer formation, plating resist formation, electrolytic copper plating, resist removal, seed layer etching, and wiring protection oxide formation. The first semiconductor ICs 11A and 11B and second semiconductor IC 12 are electronically connected with one another via the wiring 41 formed in the rewiring layer 40 (FIG. 3C).

Figure 3D:
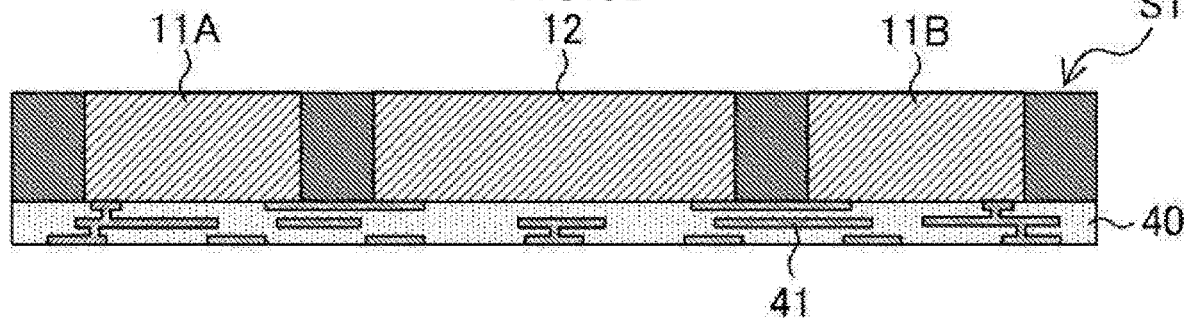
FIG. 3D is a sectional diagram illustrating an example of a step in fabrication of the semiconductor device according to the exemplary embodiment of the disclosed technology.

Then, using a publicly known backgrinding technique, the surfaces of the first semiconductor ICs 11A and 11B and second semiconductor IC 12 are exposed by grinding of the upper face S1 of the sealing member 30 (FIG. 3D).

Figure 3E:
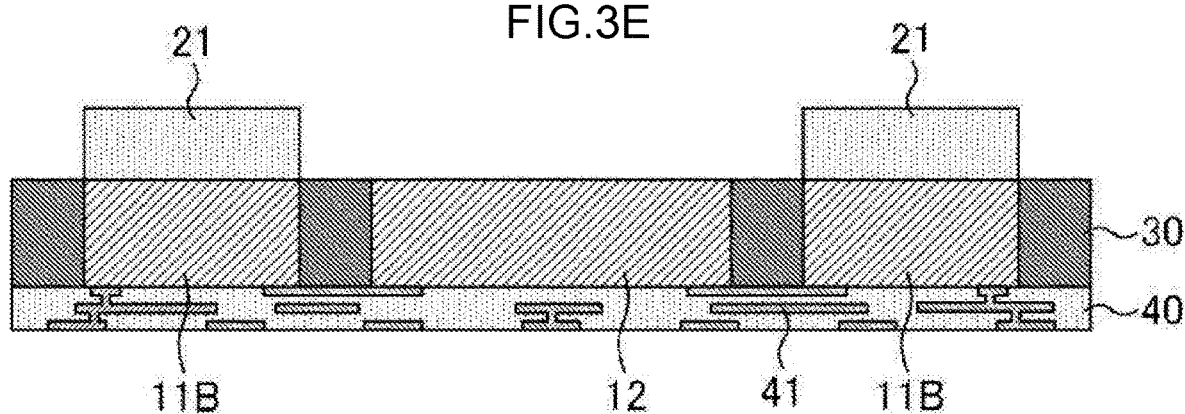
FIG. 3E is a sectional diagram illustrating an example of a step in fabrication of the semiconductor device according to the exemplary embodiment of the disclosed technology.

Then, the first heat conduction members 21 are formed so as to cover the surfaces of the first semiconductor ICs 11A and 11B exposed from the sealing member 30. If the first heat conduction members 21 are provided in a liquid form, the first heat conduction members 21 are formed by, for example, a dispensing method. If the first heat conduction members 21 are provided in a sheet form, the sheet form is cut in accordance with the sizes of the first semiconductor ICs 11A and 11B and the first heat conduction members 21 are provided on the respective surfaces of the first semiconductor ICs 11A and 11B (FIG. 3E).

Figure 3F:
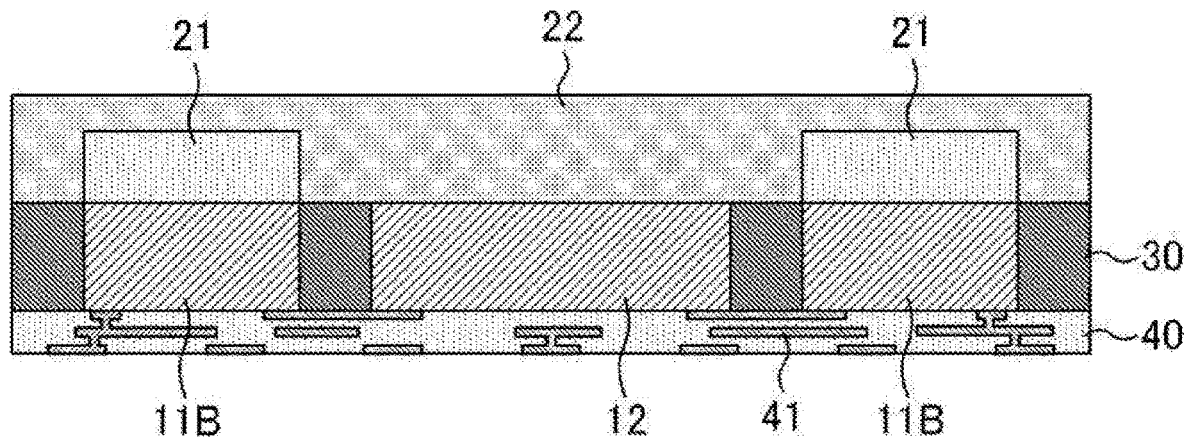
FIG. 3F is a sectional diagram illustrating an example of a step in fabrication of the semiconductor device according to the exemplary embodiment of the disclosed technology.

Then, the second heat conduction member 22 is formed so as to integrally cover the surface of the second semiconductor IC 12 exposed from the sealing member 30 and the first heat conduction members 21. If the second heat conduction member 22 is provided in a liquid form, the second heat conduction member 22 is formed by, for example, a dispensing method. If the second heat conduction member 22 is provided in a sheet form, the second heat conduction member 22 is formed by, for example, a laminating method (FIG. 3F).

Figure 3G:
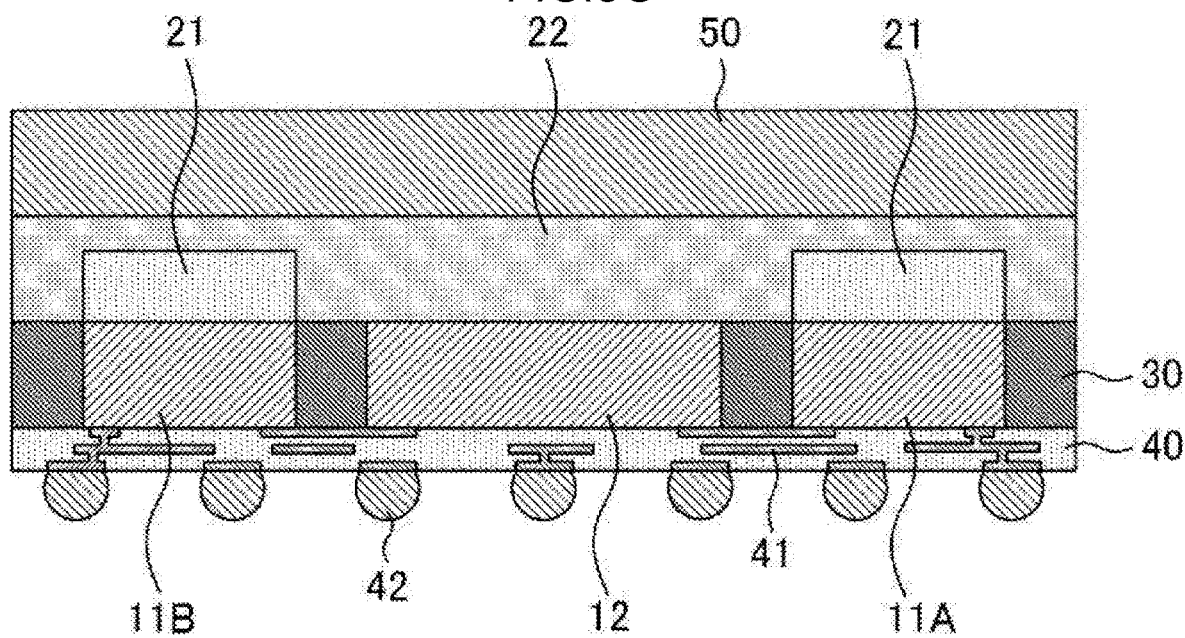
FIG. 3G is a sectional diagram illustrating an example of a step in fabrication of the semiconductor device according to the exemplary embodiment of the disclosed technology.

Then, the heat dissipation member 50 is provided so as to cover the surface of the second heat conduction member 22, after which the solder balls 42 are formed at the surface of the rewiring layer 40 at the opposite side thereof from the side at which the semiconductor ICs are placed. Thereafter, the semiconductor device 1 is separated by dicing (FIG. 3G). The diced semiconductor device 1 is placed on a mounting circuit board, which is not depicted in the drawings.

As described above, the semiconductor device 1 according to the exemplary embodiment of the disclosed technology has the form of an FOWLP. Therefore, transmission losses of high-frequency signals may be suppressed compared to a semiconductor device of a conventional flip-chip mounting type. However, because distances between the first semiconductor ICs 11A and 11B and the second semiconductor IC 12 are relatively small, transfers of heat from the first semiconductor ICs 11A and 11B with relatively large heat generation quantities to the second semiconductor IC 12 with a relatively small heat generation quantity are a concern.

According to the semiconductor device 1 according to the exemplary embodiment of the disclosed technology, the thermal conductivity $TC_1$ of the first heat conduction members 21 is lower than the thermal conductivity $TC_{2XY}$ in the horizontal direction of the second heat conduction member 22. Therefore, transfers of heat from the first semiconductor ICs 11A and 11B with relatively large heat generation quantities to the second semiconductor IC 12 with a relatively small heat generation quantity may be suppressed. As a result, a risk of the second semiconductor IC 12 being heated to a temperature above a heat resistance temperature thereof may be suppressed, and thus risks of abnormal operations and failures occurring at the second semiconductor IC 12 may be suppressed.

For example, it may be expected that a heat resistance temperature of the first semiconductor ICs 11A and 11B is 125° C. and heat generation quantities thereof are 1-50 W, and a heat resistance temperature of the second semiconductor IC 12 is 125° C. and a heat generation quantity thereof is 1-5 W. In this situation, the thermal conductivity $TC_1$ of the first heat conduction members 21 may be, for example, 1-3 W/m·K. The thermal conductivity $TC_{2XY}$ of the second heat conduction member 22 in the horizontal direction may be, for example, 10-1500 W/m·K and the thermal conductivity $TC_{2Z}$ in the height direction may be, for example, 10 W/m·K. When the thermal conductivities of the first heat conduction members 21 and the second heat conduction member 22 are in these ranges, temperatures of the first semiconductor ICs 11A and 11B and the second semiconductor IC 12 may be prevented from exceeding the heat resistance temperatures.

Figure 4:
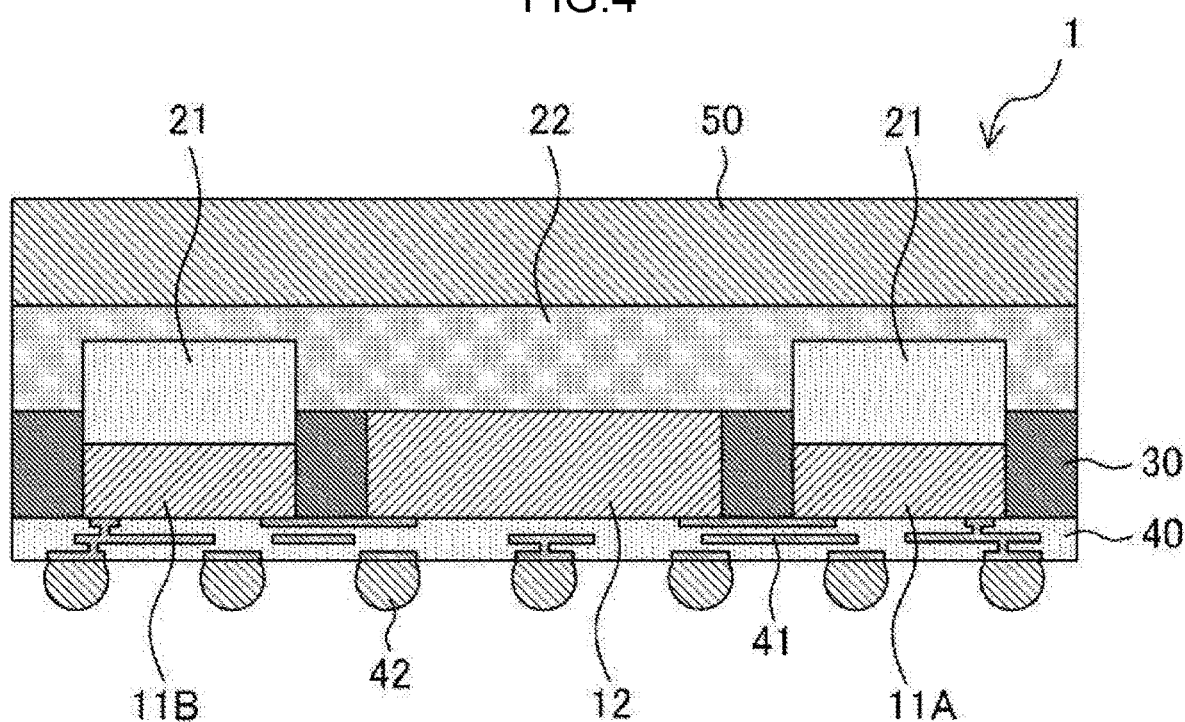
FIG. 4 is a sectional diagram depicting an example of alternative structure of the semiconductor device according to the exemplary embodiment of the disclosed technology.

FIG. 4 is a sectional diagram depicting an example of structure of the semiconductor device 1 when thicknesses of the first semiconductor ICs 11A and 11B and the second semiconductor IC 12 are different. FIG. 4 illustrates a structure in which the thickness of the first semiconductor ICs 11A and 11B is less than the thickness of the second semiconductor IC 12. In this structure, the first heat conduction members 21 are provided to be offset to the side thereof at which the sealing member 30 is provided, such that portions of the first heat conduction members 21 are embedded in the sealing member 30.

When the semiconductor device 1 with the structure depicted in FIG. 4 is fabricated, in the step of grinding the sealing member 30 (FIG. 3D), the grinding is ended at a stage at which the surface of the second semiconductor IC 12 is exposed. Thereafter, regions of the sealing member 30 that cover the surfaces of the first semiconductor ICs 11A and 11B are removed by, for example, plasma processing.

Thus, recess portions are formed in the surface of the sealing member 30, and the surfaces of the first semiconductor ICs 11A and 11B are exposed at floor faces of the recess portions. Thereafter, the first heat conduction members 21 are formed at the respective surfaces of the first semiconductor ICs 11A and 11B exposed at the floor faces of the recess portions.

In the present exemplary embodiment, a structure is illustrated in which the semiconductor device 1 is provided with two semiconductor ICs with relatively large heat generation quantities and a single semiconductor IC with a relatively small heat generation quantity. Numbers of these semiconductor ICs may be increased or reduced as appropriate. The semiconductor device 1 may be provided with components other than semiconductor ICs, such as chip capacitors and the like. In the present exemplary embodiment, a structure is illustrated in which the semiconductor device 1 has the form of an FOWLP, but the semiconductor device 1 may have an alternative form such as a flip-chip mounting type or the like.

Examples

Examples of the disclosed technology are described below. Samples were fabricated for Examples 1 to 3 and a Comparative Example, which are presented in Table 1 below. When the first semiconductor ICs 11A and 11B and the second semiconductor IC 12 generated heat, temperatures of the respective semiconductor ICs were measured. In each sample, heat generation quantities of the first semiconductor ICs 11A and 11B were 10 W and a heat generation quantity of the second semiconductor IC 12 was 0.1 W. Materials used as the second heat conduction member 22 in each sample were identical, with graphite sheets being employed (from Panasonic Corporation, $TC_{2XY}$=1500 W/m·K, $TC_{2Z}$=50 W/m·K).

TABLE 1

| | | Example 1 | Example 2 | Example 3 | Comparative Example |
|---|---|---|---|---|---|
| First heat conduction member | Thickness | 0.1 mm | ← | ← | None |
| | Material | CGW (from Sekisui Polymatech Co. Ltd.) | MANION (from Sekisui Polymatech Co. Ltd.) | Indium sheet | |
| | Thermal conductivity $TC_1$ | 3 W/m · K | 19 W/m · K | 81 W/m · K | |
| Second heat conduction member | Thickness | 0.2 mm | ← | ← | ← |
| | Material | Graphite sheet (from Panasonic Corporation) | ← | ← | ← |
| | Thermal conductivity $TC_{2XY}$ | 1500 W/m · K | ← | ← | ← |
| | Thermal conductivity $TC_{2Z}$ | 5 W/m · K | ← | ← | ← |
| First semiconductor IC | Heat generation quantity | 10 W | ← | ← | ← |
| | Temperature | 109° C. | 98° C. | 92° C. | 83° C. |
| Second semiconductor IC | Heat generation quantity | 0.1 W | ← | ← | ← |
| | Temperature | 64° C. | 68° C. | 76° C. | 81° C. |
| Temperature difference between ICs | | 45° C. | 30° C. | 16° C. | 2° C. |

In the sample relating to Example 1, CGW (registered trademark. from Sekisui Polymatech Co. Ltd., $TC_1$=3 W/m·K) was used for the first heat conduction members 21. A temperature of the first semiconductor ICs 11A and 11B was 109° C. and a temperature of the second semiconductor IC 12 was 64° C., giving a temperature difference between the ICs of 45° C.

In the sample relating to Example 2, Manion (registered trademark, from Sekisui Polymatech Co. Ltd., $TC_1$=19 W/m·K) was used for the first heat conduction members 21. A temperature of the first semiconductor ICs 11A and 11B was 98° C. and a temperature of the second semiconductor IC 12 was 68° C. giving a temperature difference between the ICs of 30° C.

In the sample relating to Example 3, An indium sheet was used for the first heat conduction members 21 ($TC_1$=81 W/m·K). A temperature of the first semiconductor ICs 11A and 11B was 92° C. and a temperature of the second semiconductor IC 12 was 76° C., giving a temperature difference between the ICs of 16° C.

In the sample relating to the Comparative Example, the first heat conduction members 21 were not employed. That is, the sample relating to the Comparative Example had a structure in which surfaces of the first semiconductor ICs 11A and 11B and the second semiconductor IC 12 are integrally covered by the second heat conduction member 22. A temperature of the first semiconductor ICs 11A and 11B was 83° C. and a temperature of the second semiconductor IC 12 was 81° C., giving a temperature difference between the ICs of 2° C.

As described above, it was confirmed that the lower the thermal conductivity $TC_1$ of the first heat conduction members 21, the more transfers of heat from the first semiconductor ICs 11A and 11B to the second semiconductor IC 12 are suppressed. That is, it was confirmed that the thermal conductivity $TC_1$ of the first heat conduction members 21 being lower than the thermal conductivity $TC_{2XY}$ in the horizontal direction of the second heat conduction member 22 is effective for suppressing the transfer of heat from the first semiconductor ICs 11A and 11B to the second semiconductor IC 12.

According to the present disclosure, in a semiconductor device that includes plural semiconductor ICs with mutually different heat generation quantities, transfer of heat between the semiconductor ICs may be suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first semiconductor IC;
   a second semiconductor IC that is smaller in heat generation quantity than the first semiconductor IC;
   a first heat conduction member disposed at an upper layer of at least a portion of the first semiconductor IC;
   a second heat conduction member disposed at an upper layer of the second semiconductor IC and surrounding the first heat conduction member; and
   a heat dissipation member disposed along a horizontal direction at an upper layer of the second heat conduction member, the horizontal direction being a direction in which the first semiconductor IC and the second semiconductor IC are arrayed,
   wherein a thermal conductivity of the first heat conduction member is lower than a thermal conductivity in the horizontal direction of the second heat conduction member.

2. The semiconductor device according to claim 1, wherein a thermal conductivity of the second heat conduction member in a height direction intersecting the horizontal direction is lower than the thermal conductivity thereof in the horizontal direction.

3. The semiconductor device according to claim 2, wherein the thermal conductivity in the height direction of the second heat conduction member is lower than the thermal conductivity of the first heat conduction member.

4. The semiconductor device according to claim 3, wherein a thickness of the second heat conduction member at the upper layer of the first heat conduction member is at most 1 mm.

5. The semiconductor device according to claim 1, further comprising a sealing member that seals the first semiconductor IC and the second semiconductor IC, wherein
   the first heat conduction member covers a surface of the first semiconductor IC that is exposed from the sealing member, and
   the second heat conduction member covers a surface of the second semiconductor IC that is exposed from the sealing member.

6. The semiconductor device according to claim 2, further comprising a sealing member that seals the first semiconductor IC and the second semiconductor IC, wherein
   the first heat conduction member covers a surface of the first semiconductor IC that is exposed from the seating member, and
   the second heat conduction member covers a surface of the second semiconductor IC that is exposed from the sealing member.

7. The semiconductor device according to claim 3, further comprising a sealing member that seals the first semiconductor IC and the second semiconductor IC, wherein
   the first heat conduction member covers a surface of the first semiconductor IC that is exposed from the sealing member, and
   the second heat conduction member covers a surface of the second semiconductor IC that is exposed from the sealing member.

8. The semiconductor device according to claim 1, further comprising a rewiring layer that electronically connects the first semiconductor IC and the second semiconductor IC.

9. The semiconductor device according to claim 2, further comprising a rewiring layer that electronically connects the first semiconductor IC and the second semiconductor IC.

10. The semiconductor device according to claim 3, further comprising a rewiring layer that electronically connects the first semiconductor IC and the second semiconductor IC.

11. The semiconductor device according to claim 1, wherein the first semiconductor IC includes a substrate formed of monocrystalline silicon and the second semiconductor IC includes a substrate formed of a compound semiconductor.

12. The semiconductor device according to claim 2, wherein the first semiconductor IC includes a substrate formed of monocrystalline silicon and the second semiconductor IC includes a substrate formed of a compound semiconductor.

13. The semiconductor device according to claim 3, wherein the first semiconductor IC includes a substrate formed of monocrystalline silicon and the second semiconductor IC includes a substrate formed of a compound semiconductor.

14. The semiconductor device according to claim 1, wherein the second heat conduction member is a graphite sheet.

15. The semiconductor device according to claim 2, wherein the second heat conduction member is a graphite sheet.

16. The semiconductor device according to claim 3, wherein the second heat conduction member is a graphite sheet.

17. A semiconductor device fabrication method comprising:
- sealing a first semiconductor IC and a second semiconductor IC in a sealing member, the second semiconductor IC being smaller in heat generation quantity than the first semiconductor IC;
- grinding the sealing member and causing surfaces of the first semiconductor IC and the second semiconductor IC to be exposed from the sealing member;
- disposing a first heat conduction member at an upper layer of the first semiconductor IC exposed from the sealing member;
- disposing a second heat conduction member at an upper layer of the second semiconductor IC exposed from the sealing member and surrounding the first heat conduction member; and
- disposing a heat dissipation member along a horizontal direction at an upper layer of the second heat conduction member, the horizontal direction being a direction in which the first semiconductor IC and the second semiconductor IC are arrayed,
- wherein a thermal conductivity of the first heat conduction member is lower than a thermal conductivity in the horizontal direction of the second heat conduction member.

* * * * *